United States Patent [19]
Balsells

[11] Patent Number: 5,545,842
[45] Date of Patent: *Aug. 13, 1996

[54] RADIALLY MOUNTED SPRING TO CONNECT, LOCK AND UNLOCK, AND FOR SNAP-ON FASTENING, AND FOR MECHANICAL, ELECTROMAGNETIC SHIELDING, ELECTRICAL CONDUCTIVITY, AND THERMAL DISSIPATION WITH ENVIRONMENTAL SEALING

[75] Inventor: Peter J. Balsells, Santa Ana, Calif.

[73] Assignee: Bal Seal Engineering Company, Inc., Santa Ana, Calif.

[ * ] Notice: The term of this patent shall not extend beyond the expiration date of Pat. No. 5,411,348.

[21] Appl. No.: 143,913

[22] Filed: Oct. 26, 1993

[51] Int. Cl.⁶ ..................................................... H05K 9/00
[52] U.S. Cl. .................... 174/35 GC; 72/135; 267/166; 285/318; 403/357
[58] Field of Search ................ 174/35 R, 35 GC, 174/35 C, 35 MS; 361/816, 818; 403/326, 334, 357, 368, 372; 411/348, 352, 353; 72/135, 371; 140/88, 89; 267/1.5, 152, 160, 161, 167, 180, 166.1, 166, 168, 286, 288, 289, 290; 277/163, 164, 157, 158, 235 R, 153; 285/318

[56] References Cited

U.S. PATENT DOCUMENTS

| | | | |
|---|---|---|---|
| 4,655,462 | 4/1987 | Balsells | 277/164 |
| 4,826,144 | 5/1989 | Balsells | 267/167 |
| 4,830,344 | 5/1989 | Balsells | 267/167 |
| 4,876,781 | 10/1989 | Balsells | 29/173 |
| 4,893,795 | 1/1990 | Balsells | 267/1.5 |
| 4,907,788 | 3/1990 | Balsells | 267/168 |
| 4,915,366 | 4/1990 | Balsells | 267/167 |
| 4,934,666 | 6/1990 | Balsells | 267/1.5 |
| 4,961,253 | 10/1990 | Balsells | 29/173 |
| 4,964,204 | 10/1990 | Balsells | 29/173 |
| 4,974,821 | 12/1990 | Balsells | 267/167 |
| 5,072,070 | 12/1991 | Balsells | 174/35 GC |
| 5,079,388 | 1/1992 | Balsells | 174/35 GC |
| 5,108,078 | 4/1992 | Balsells | 267/167 |
| 5,117,066 | 5/1992 | Balsells | 174/35 GC |
| 5,134,244 | 7/1992 | Balsells | 174/35 GC |
| 5,160,122 | 11/1992 | Balsells | 267/167 |
| 5,161,806 | 11/1992 | Balsells | 277/163 |
| 5,203,849 | 4/1993 | Balsells | 277/163 |
| 5,411,348 | 5/1995 | Balsells | 403/326 |

*Primary Examiner*—Kristine L. Kincaid
*Assistant Examiner*—Christopher Horgan
*Attorney, Agent, or Firm*—Walter A. Hackler

[57] ABSTRACT

A mechanism for connecting and disconnecting, locking and unlocking, and holding members to one another, including snap-on fasteners, and at the same time providing mechanical, electromagnetic shielding, electrical conductivity, and thermal dissipation, coupled with environmental sealing, is provided by a cylindrical or elliptical body having a circumferential groove therein and a continuous coil spring disposed therein. A housing, having a bore sized to accommodate the cylindrical, or spherical, body, is provided, and a tapered bottom in the circumferential groove prevents the spring from turning past a vertical line, thus locking or connecting the cylindrical, or spherical, member with the housing or plate.

36 Claims, 5 Drawing Sheets

RADIALLY MOUNTED SPRING TO CONNECT, LOCK AND UNLOCK, AND FOR SNAP-ON FASTENING, AND FOR MECHANICAL, ELECTROMAGNETIC SHIELDING, ELECTRICAL CONDUCTIVITY, AND THERMAL DISSIPATION WITH ENVIRONMENTAL SEALING

The present invention generally relates to mechanisms for connecting and locking, connecting and unlocking, and connecting and holding two surfaces utilizing a canted-coil spring. More particularly, the surfaces may be cylindrical or spherical; and electromagnetic shielding, electrical conductivity, heat dissipation and environmental sealing may also be effected through the use of the present invention.

Canted-coil springs suitable for the present invention and a description thereof, along with the loading characteristics of such springs, may be found in U.S. Pat. Nos. 4,655,462; 4,826,144; 4,830,344; 4,876,781; 4,893,795; 4,907,788; 4,915,366; 4,934,666; 4,961,253; 4,964,204; 4,974,821; 5,072,070; 5,079,388; 5,108,078; 5,117,066; 5,134,244; 5,160,122; 5,161,806; and 5,203,849. All of these patents have been issued to Peter J. Balsells.

In addition, the hereinabove referenced issued patents, which are herewith incorporated by specific reference thereto, describe, in general, electromagnetic shielding effectiveness of coil spring assemblies, particularly U.S. Pat. Nos. 4,934,666; 5,079,388; and 5,134,244.

The present invention provides for a mechanism suitable for many mechanical and electrical applications. In particular, in electrical applications, the greatest suitability for the present invention combines environmental sealing with enhanced electrical conductivity. Through the use of an elastomer with a spring in intimate contact with surrounding coils is provided for achieving enhanced environmental sealing. The intimate contact between loaded points also enables a foreign material, such as moisture, dust or oxidation that may be present, thus providing an effective environmental seal.

SUMMARY OF THE INVENTION

A connect/disconnect, lock/unlock, snap-on fastening and hold mechanism for mechanical, electromagnetic shielding, electrical conductivity and thermal dissipation, with further provision for environmental sealing, in accordance with the present invention, generally includes a cylindrical or spherical body having a circumferential grove therein with generally parallel side walls. A continuous coil spring is provided and disposed in the circumferential groove with a portion thereof protruding from the circumferential groove.

Further, in accordance with the present invention, a housing is provided which has a bore sized to accommodate the cylindrical, or spherical, body. Groove means, disposed on an inside surface of the bore, are provided for receiving the protruding spring portion and for enabling assembly of the cylindrical, or spherical, body within the bore when the cylindrical, or spherical, body and housing are moved in one direction with respect to another.

In addition, means defining a tapered bottom in the circumferential groove is provided for preventing the spring from turning past a vertical line when the cylindrical, or spherical, body and housing are moved in another direction with respect to one another. This structure prevents disassembly of the cylindrical, or spherical, body and housing when they are moved in another direction with respect to one another.

More particularly in accordance with the present invention, the circumferential groove may have a groove width which is smaller than a coil height of the spring. In addition, the tapered bottom may join one of the general parallel side walls at an angle between about 0° and about 60°.

Preferably, the tapered bottom may join both parallel side walls at an angle between about 10° and 20°.

The groove means may include a surface of revolution disposed at an angle with the cylindrical, or spherical, body axis.

In another embodiment of the present invention, the tapered bottom may include two flat surfaces intersecting one another and each disposed at an acute angle to an adjoining parallel side wall. This enables the cylindrical, or spherical, body and housing to be locked in both directions, as hereinafter described in greater detail.

Preferably, the continuous spring includes coils sized for causing adjacent coils to abut one another upon assembly of the cylindrical, or spherical, body within the bore in order to increase magnetic shielding, electrical conductivity, thermal dissipation and environmental sealing between the cylindrical, or spherical, body and the housing.

Enhanced environmental sealing may be preferably enhanced by utilizing a spring filled with an elastomer which may be hollow or solid.

In an alternative embodiment of the present invention, a housing includes a bore therein having a circumferential groove with generally parallel side walls with a continuous coil spring disposed therein with a portion protruding therefrom.

A cylindrical, or spherical, body is sized for insertion into the bore, and groove means disposed on an outside surface of the cylindrical, or spherical, body is provided for receiving the protruding spring portion and for enabling assembly of the cylindrical, or spherical, body within the bore when the cylindrical, or spherical, body and housing are moved in one direction with respect to one another.

In addition, means are provided for defining a tapered bottom in the circumferential groove for preventing the spring from turning past a vertical line when the cylindrical, or spherical, body and housing are moved in another direction with respect to one another in order to prevent disassembly of the cylindrical, or spherical, body and housing.

In a fastener embodiment of the present invention suitable for snap-on fastenings, a cylindrical body includes a body diameter and an end portion having a diameter smaller than the body diameter. Means are provided which define a circumferential groove in the end portion with generally parallel side walls and a continuous coiled spring is disposed in the circumferential groove with a portion thereof protruding the circumferential groove.

A plate is provided which has a thickness and an opening therein with a diameter greater than the end portion diameter and smaller than the body diameter. The plate provides means for receiving the end portion with the spring protruding from the circumferential groove on the side of the plate opposite another side of the plate facing a cylindrical body.

Means defining a tapered bottom in the circumferential groove are provided for preventing the spring from turning past a line perpendicular to the cylindrical body access in order to prevent disassembly of the cylindrical body from the plate.

BRIEF DESCRIPTION OF THE DRAWINGS

The advantages and features of the present invention will be better understood by the following description when considered in conjunction with the accompanying drawings in which.

DETAILED DESCRIPTION

Figure 1:
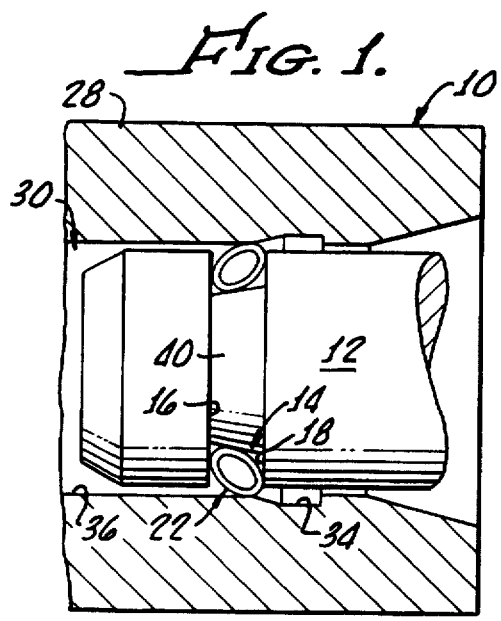
FIG. 1 is a cross-sectional view of one embodiment in accordance with the present invention in which a spring is disposed in a housing with a piston shown in a disconnected position with the housing assembly.

Turning now to FIG. 1, there is shown a mechanism in accordance with the present invention which generally includes a cylindrical body 12 having a circumferential groove 14 therein with generally parallel side walls 16, 18.

A continuous coil spring 22 is disposed within the groove 14 having a portion 24 protruding from the circumferential groove 14.

A housing 28 is provided having a bore 30 which is sized for accommodating the cylindrical body 12.

Figure 2:
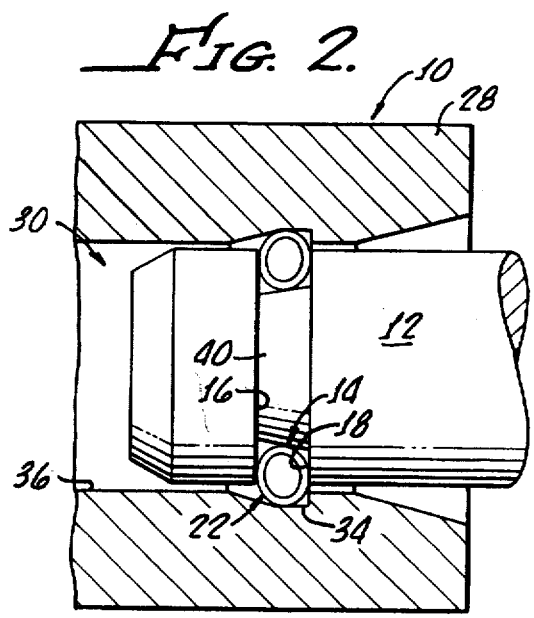
FIG. 2 is a view of the embodiment shown in FIG. 1 showing the piston in a locked position within the housing.

A groove 34, disposed on an inside surface 36 of a bore 30, provides a means for receiving the protruding spring portion 24 and for enabling assembly of the cylindrical body 12 within the bore 30 when the cylindrical body 12 and housing 28 are moved in the direction of arrows 40, 42, shown in FIGS. 1 and 2, respectively. FIG. 1 shows the piston in a disconnected, or unlocked, position with respect to the housing 28, and FIG. 2 shows the piston in a connected, or locked, position with respect to the housing 28.

A tapered bottom 40 of the groove 14 provides a means for preventing the spring 22 from turning past a vertical line 44 (see FIG. 3) when the cylindrical body 12 and housing 28 are moved in another, opposite, direction as indicated by the arrow 46. This prevents disassembly of the cylindrical body 12 and the housing 28 in the direction of the arrow 46. While the bottom may be flat, improved reliability is achieved with the tapered bottom because it facilitates assembly and disassembly with minimum stress concentration on the spring 22.

Figures 3, 4, 5:
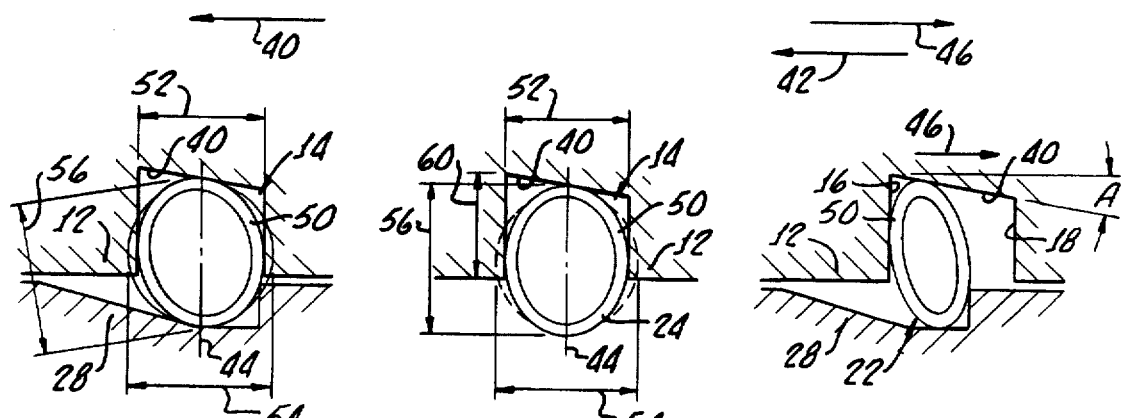
FIG. 3 is an enlarged view of the spring disposed between the piston and housing shown in FIGS. 1 an 2.
FIG. 4 is a cross-sectional view of the spring shown in FIG. 3 in a free position.
FIG. 5 is the spring shown in FIG. 3 shown in a locked configuration.

FIG. 3 is an enlarged view of the spring 22 showing a coil 50 in a loaded position between the cylindrical body 12 and the housing 28. FIG. 4 shows the coil 50 in a free position within the piston groove 14 and showing a circumferential groove 14 having a groove width 52, which is smaller than a coil height 54, as shown by the dashed lines in FIG. 4. The coil also has a coil width 56, which is greater than a maximum groove depth 60, thereby enabling the coil portion 24 to protrude from the groove 14.

FIG. 5 shows the spring 22 in a compressed position locking the cylindrical body 12 to the housing 28. As shown in FIG. 5, the tapered bottom 40 may join both the parallel side walls 16, 18 at an angle A. The degree of force to compress, connect and unlock is substantially influenced by the taper angle A; the smaller the taper, the higher the force.

As the taper angle increases, the force decreases. The angle A may vary from 0° to 89°, but preferably the angle A is between about 10° and about 20°.

Figure 6:
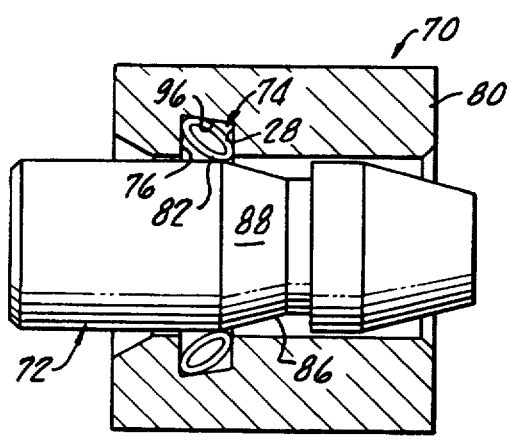
FIG. 6 is an alternative embodiment of the present invention in which the spring is mounted in a housing showing the piston in an unlocked or disconnected/position.
Figure 7:
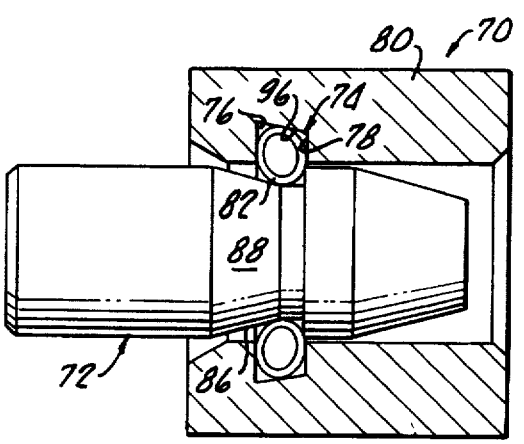
FIG. 7 is another view of the embodiment shown in FIG. 6 showing the piston in the locked position.

FIGS. 6 and 7 show an alternative embodiment 70, in accordance with the present invention, having a cylindrical body 72 and a groove 74 with side walls 76, 78 disposed in a housing 80 with a spring 82 disposed therein. The groove 86 having a ramp portion 88 functions in the same manner as the embodiment 10 shown in FIGS. 1–5. FIG. 6 shows the cylinder in an unlocked, or disconnected, position and FIG. 7 shows the cylindrical body 72 in a locked, or connected, position with respect to the housing 80.

Movement of the piston in the direction of arrow 90 is prevented by the spring 82 while movement in the direction of arrow 92 enables the cylindrical body 72 to be disconnected from the housing 80. The tapered bottom 40 of the embodiment 10, 96 and embodiment 70 provides a substantially greater degree of reliability because it facilitates assembly and disassembly with a minimum stress concentration acting on the spring, thus increasing its reliability.

In addition, the amount of locking force, as hereinabove noted, may be controlled by the angle A of the tapered bottom.

Figure 8:
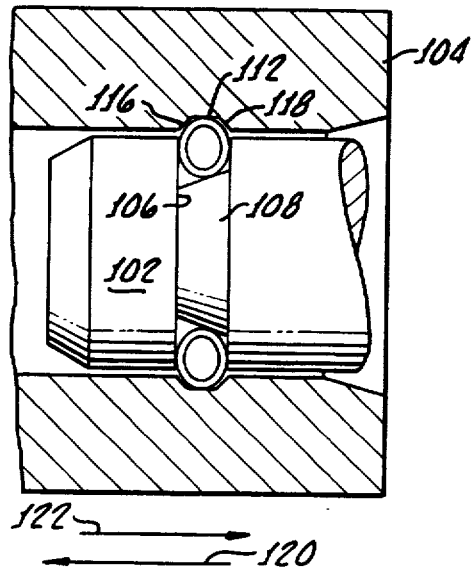
FIG. 8 is an alternative embodiment of the present invention showing a radial detent in a housing having an angle on both sides of a groove therein with a tapered bottom and a piston groove causing a force necessary to disconnect the piston in one direction to be less than the force necessary to disconnect the piston moving it in another direction.

FIG. 8 shows an alternative embodiment 100 which includes a cylindrical body, or a piston, 102 disposed within a housing 104. A groove 106 in the piston 102 includes a tapered bottom for supporting a spring 110. A radial detent 112 in the housing 104 includes ramp portions 116, 118 on each side thereof to facilitate assembly and connecting of the piston 102 with the housing 104 in both directions, as indicated by the arrows 120, 122.

Figure 9:
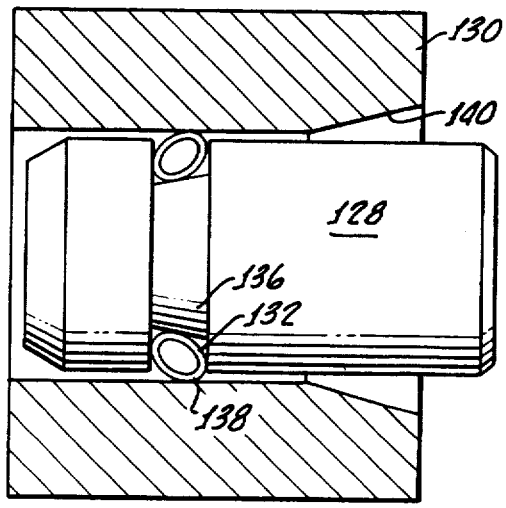
FIG. 9 is an alternative embodiment of the present invention showing a housing configuration for holding a piston with a spring particularly suitable for electromagnetic shielding and thermal dissipation.

FIG. 9 shows yet another embodiment 126, in accordance with the present invention, generally showing a piston 128 within a housing 130 with a groove 132 having a tapered bottom 136, or a flat bottom, not shown, for receiving a spring 138 and holding 126 to body 12. A ramp portion 140 on the housing 130 facilitates assembly of the piston 128 within the housing 130.

Figure 10:
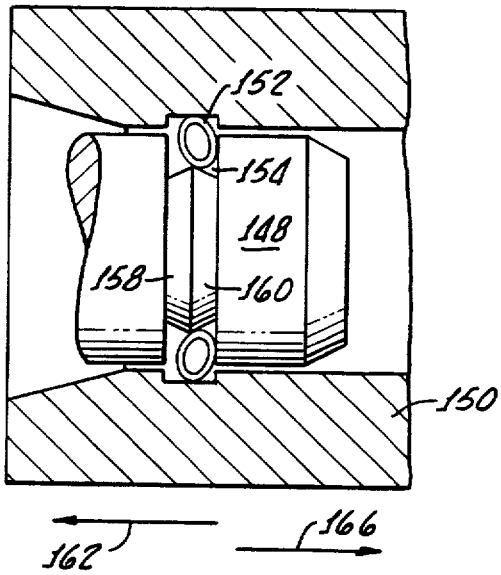
FIG. 10 shows a radially mounted spring and a piston with a detent in a housing in which two tapered sections provide a bottom for the piston groove.
Figure 11:
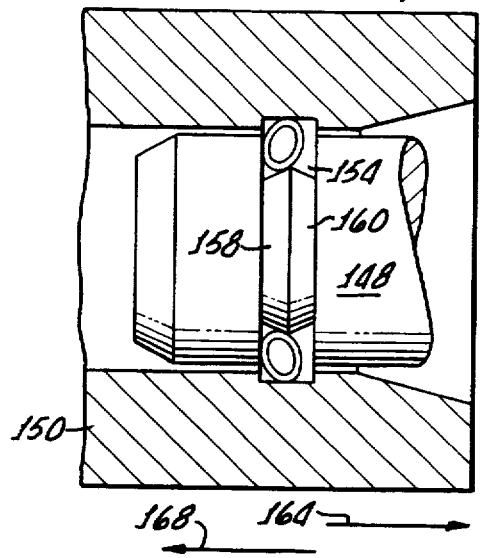
FIG. 11 is an embodiment similar to that shown in FIG. 10, showing the spring in a different arrangement within the piston groove.
Figure 12:
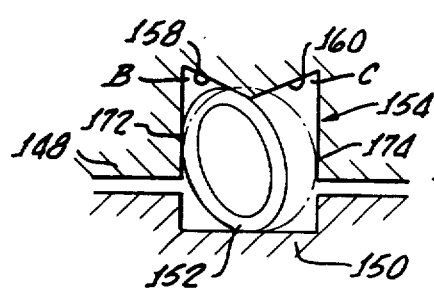
FIG. 12 is an enlarged cross-sectional view of the spring shown in the embodiments of FIGS. 10 and 11.

The embodiment 146, shown in FIGS. 10, 11 and 12, enables a piston 148 to be connected and locked in both directions within a housing 150. For the purposes of the present description, this term means that the piston 148 is locked in one direction but can be disconnected in the opposite direction and, by switching the position of a spring 152 within a groove 154, having two tapered surfaces 158, 160 connect and lock can be achieved in the opposite direction. In FIGS. 10 and 11, a locked position is indicated by the arrows 162, 164; and the unlocked position is indicated by the arrows 166, 168. As most clearly shown in FIG. 12, the tapered surfaces 158, 160 join respective groove side walls 172, 174 at angles B, C which are acute. Thus, depending upon the position of the spring 152, locking action can be achieved in one direction, as shown by the arrows 162, 164 or in the opposite direction, as indicated by the arrows 166, 168.

Figure 13:
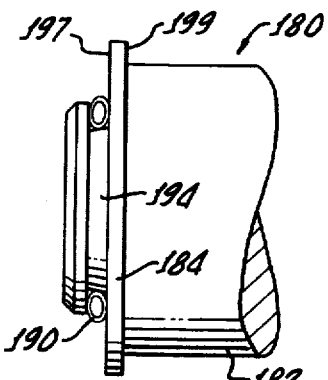
FIG. 13 is a fastener embodiment of the present invention showing a variation of a tapered bottom with the piston locked to a plate.

In FIG. 13 there is yet another embodiment 180 in accordance with the present invention, which provides a snap-on fastening connection between a cylindrical member 182 and a housing plate 184. The cylindrical member 182 and plate 184 are held together by means of a canted-coil spring 190. The member 182 may be cylindrical although means of fabrication to other geometries, such as rectangular or elliptical shape (not shown), may be utilized. In addition, the spring 190 may be mounted in the piston in a circular pattern as shown or in the housing.

Figure 14:
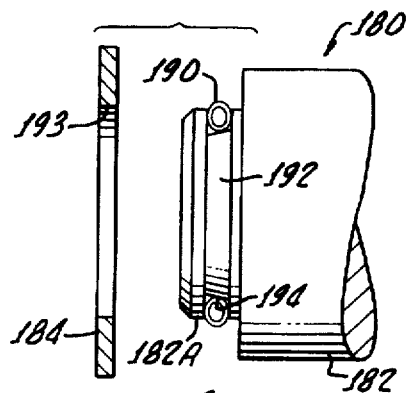
FIG. 14 is a view similar to the fastener embodiment shown in FIG. 13, showing the spring in a free position and the plate separated from the cylindrical body before assembly thereof.

FIG. 14 shows the embodiment 180 with the plate 184 separated from the cylindrical housing 182. A groove 182 in an end portion 182A moves a tapered bottom 194.

Figure 16:
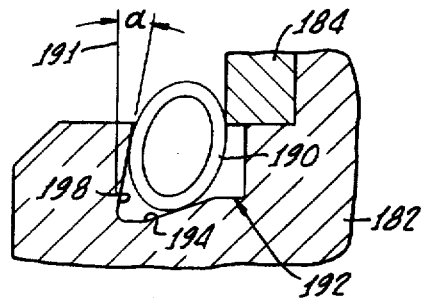
FIG. 16 is an enlarged view of the spring shown in FIG. 13.

As shown in FIG. 16, a tapered bottom 194 in the circumferential groove 192 prevents a spring 190 from rotating past a line 191 perpendicular to the cylindrical body axis in order to prevent disassembly of the cylindrical body 182 from the plate 184.

The plate 184 has a selected thickness and an opening 193 therein with a diameter greater than the diameter of the end portion 182A and smaller than the body 182 diameter for receiving the end portion 182A with the spring protruding, as shown in FIG. 13, from the circumferential groove 192 on a side 197 of the plate 184 opposite another side 199 of the plate 184 facing the cylindrical body 182.

Figure 15:
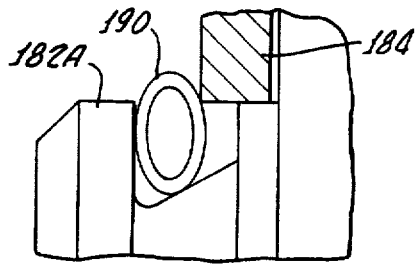
FIG. 15 is a view similar to the fastener embodiment shown in FIG. 14, showing the cylindrical body and plate member fully assembled.

Turning to FIG. 15, there is shown an enlarged view of the end portion 182A showing the spring 190 in a fully assembled position.

As most clearly shown in FIG. 16, the groove 192 in the member 182 includes a tapered bottom 194. The tapered groove 192 permits substantially a greater degree of flexibility in assembly and the angle of the taper influences such flexibility as hereinabove noted. After the assembly takes place, it is necessary that the spring have sufficient force to snap inward or outward and create the actual locking action that keeps the member 182 and the plate 184 together.

In addition, an outward groove side wall 198 may disposed at an angle α for the purpose of preventing the spring 190 from vibrating out of the groove 192 and further provide a greater degree of reliability of performance.

The spring 190 may be sized so that it is compressed in a manner that the coils will butt or nearly butt to provide for effective electromagnetic shielding and improved electrical conductivity between the member 182 and plate 184 as well as provide improved thermal dissipation and environmental sealing. In this configuration, destruction of the spring 190 may be necessary in order to separate the member 182 from the plate 184.

Figure 17:
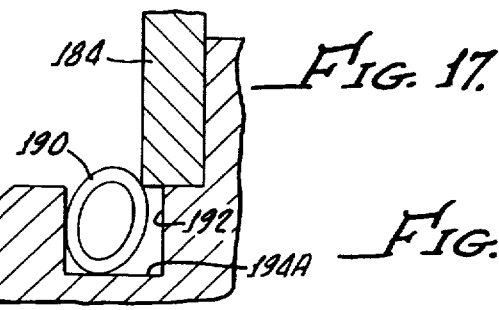
FIG. 17 is an alternative view of the present invention in which the groove has a flat bottom.

FIG. 17 is an alternative embodiment of the present invention in which the groove 192 includes a flat bottom 194A. While performance with this configuration may be adequate in certain snap-on fastening applications, it is preferred that the groove 192 bottom be tapered as hereinabove described.

Figure 18:
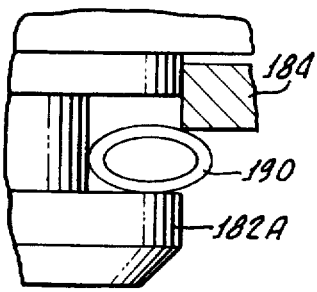
FIG. 18 is a view similar to the fastener embodiment shown in FIG. 17 with a spring butted against a plate, thereby preventing disassembly of the cylindrical body and the plate.

FIG. 18 is a view similar to FIG. 17 showing the spring 190 in a compressed or butted position with respect to the plate 184 and the end portion 182A, thereby preventing disassembly of the plate 184 from the cylindrical body 182.

Figure 19:
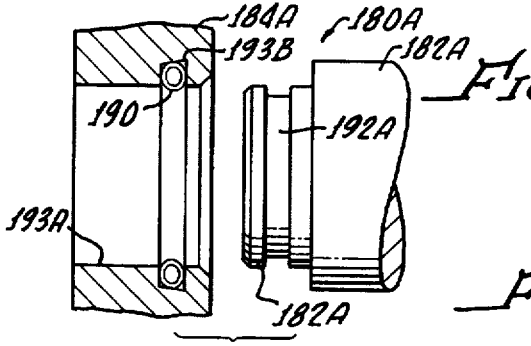
FIG. 19 shows a snap-on embodiment in which the cylindrical body is fastened to a housing.

FIG. 19 is another alternative snap-on fastener mechanism 180A which includes a cylindrical body 182A with an end portion 182B with a groove 192A fastening, with housing 184A having a bore 193A with a groove 193B therein. The snap-on fastening operation is similar to that described in connection with the fastener 180 shown in FIG. 14.

Figure 20:
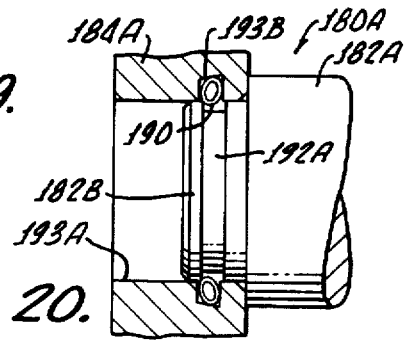
FIG. 20 is similar to the embodiment shown with the cylindrical body inserted into the housing.
Figure 21:
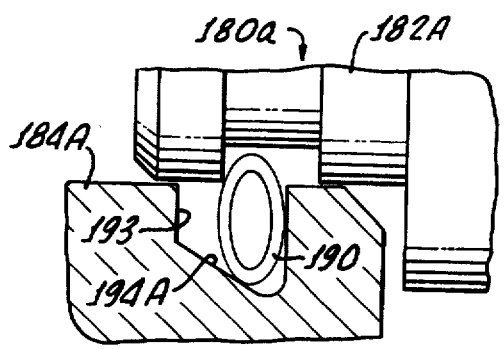
FIG. 21 is an enlarged view of the spring shown in FIG. 20 showing the compressed, or butted, spring preventing the disassembly of the cylindrical body in the housing.

FIG. 20 is a view similar to FIG. 19 with the cylinder 182A in engagement with the housing 184A. FIG. 21 shows a view of the embodiment 180A with the spring 190 disposed in the groove 193B, having a tapered bottom 194A.

Figure 22:
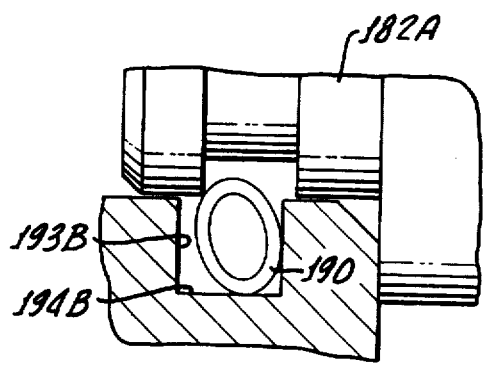
FIG. 22 is an alternative embodiment of the present invention similar to that shown in FIG. 20 with the groove having a flat bottom.
Figure 23:
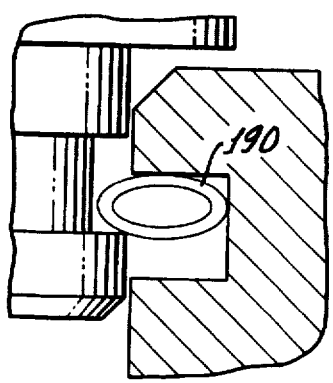
FIG. 23 is an enlarged view of the spring showing the compressed, or butted, spring preventing disassembly of the cylindrical body from the housing.

FIG. 22 is a view similar to that shown in FIG. 21 with the groove 193B having a flat bottom 194B. FIG. 23 is a view similar to that shown in FIG. 22 in which the spring 190 is compressed, or butted, thereby preventing disassembly of the cylindrical body 182A from the housing 184A.

Figure 24:
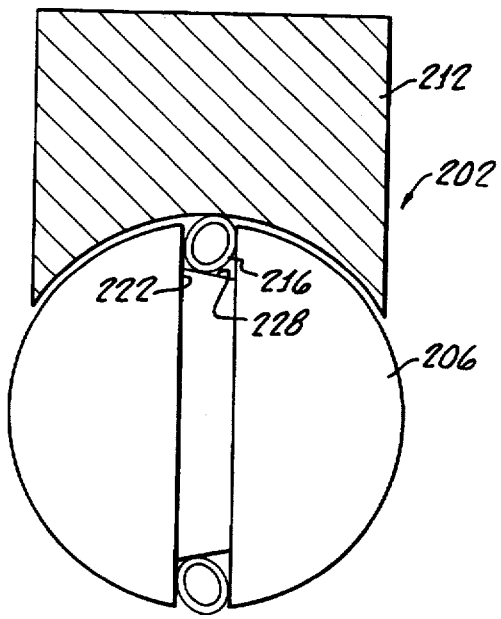
FIG. 24 is another embodiment of the present invention in which the groove is disposed within a spherical body.
Figure 25:
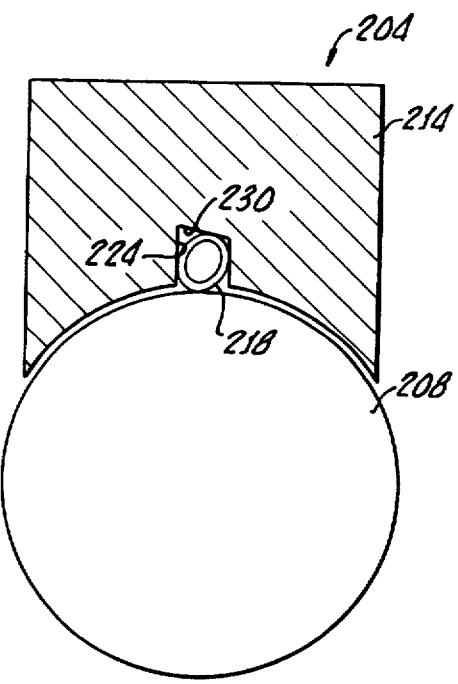
FIG. 25 is yet another embodiment of the present invention in which the groove is disposed within a housing for supporting a spherical body.

As shown in FIGS. 24 and 25 respectively, there are two additional embodiments 202, 204 of the present invention showing spherical members 206, 208 mounted to a housing 212, 214 respectively through the use of springs 216, 218, disposed in grooves 222,224 respectively. In embodiment 202, the groove 222 is disposed within the spherical member 206 and in the embodiment 204, the groove 224 is disposed within the housing 214. As hereinabove noted, the groove width is preferably smaller than the coil height, and the grooves 222, 224 include tapered bottoms 228, 230, a flat bottom, not shown, which function in the manner as hereinabove described.

Environmental sealing may be enhanced for any of the hereinabove described embodiments by filling springs 236, 238, 240 with elastomer 242, 244, 246, as shown in FIGS. 26a–28b.

Figure 26A:
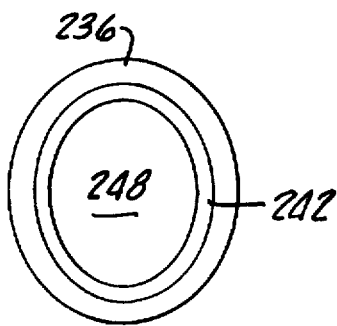
FIGS. 26a, 26b are cross-sectional views of an elastomer-filled spring having a hollow center suitable for use in the present invention.
Figure 26B:
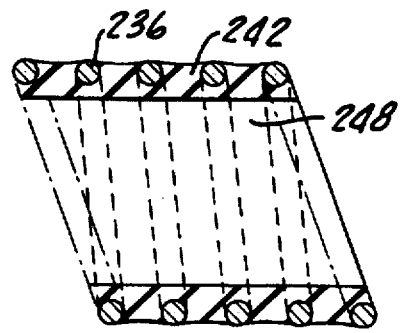
Figure 27A:
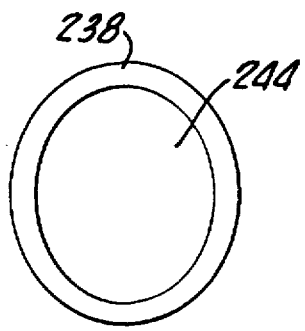
FIGS. 27a, 27b are alternative embodiments of the spring suitable for use in the present invention having a solid elastomer therein.
Figure 27B:
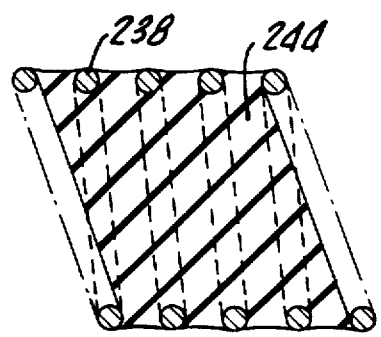
Figure 28A:
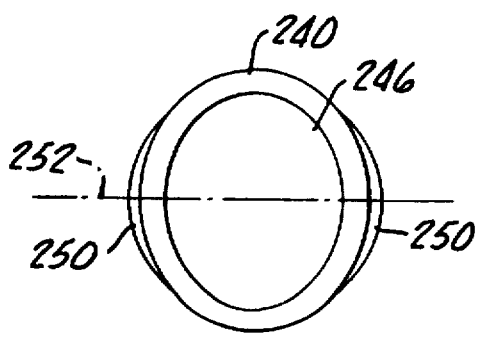
FIGS. 28a, 28b are other embodiments of the spring in accordance with the present invention having an elastomer therein extending exterior to the coils along minor axes thereof.
Figure 28B:
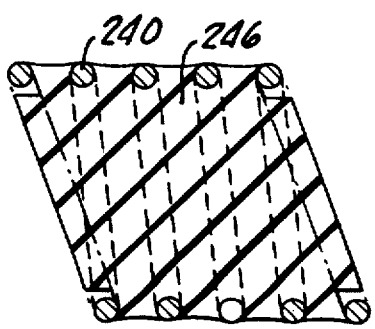

With specific reference to FIG. 26a, the elastomer may have a hollow center 248 or, as shown in FIG. 28a, the elastomer may have portions 250 protruding beyond the spring 240 along a minor axis 252 thereof. Canted-coil, elastomer-filled spring assemblies suitable for the present invention are taught in U.S. Pat. No. 5,161,806, as hereinabove noted, which is incorporated herewith by this specific reference thereto for teaching elastomer filled springs.

For applications that require electromagnetic shielding, electrical conductivity, or heat dissipation, or a combination of them, it is necessary that upon loading of the spring 236, 238, 240 that the portion under load, the protruding portion, provides electrical conductivity which is achieved by removing insulating material such as elastomers, dust, moisture and oxidation, etc. from the spring wire at the loading points of contact so that such electrical conductivity is enabled.

To achieve the highest degree of conductivity and reliability, as well as environmental sealing, the highest reciprocity possible should be achieved at the loading points, and this occurs when the groove width 52, as shown in FIG. 4, is smaller than the coil height 54 with a very small tapered bottom, resulting in a high load along the major axis of the elliptical coil 24. The intimate contact between the loading points also eliminates foreign material, such as dust, moisture, or oxidation that may be present, from entering the groove 14, thus providing effective environmental sealing.

Although there has been hereinabove described specific embodiments of the present invention, for the purpose of illustrating the manner in which the invention may be used to advantage, it should be appreciated that the invention is not limited thereto. Accordingly, any and all modifications, variations, or equivalent arrangements which may occur to those skilled in the art, should be considered to be within the scope of the present invention as defined in the appended claims.

What is claimed is:

1. A connect/disconnect, lock/unlock and hold mechanism for mechanical, electromagnetic shielding, electrical conductivity, and thermal dissipation coupling with environmental sealing, the mechanism comprising:

a cylindrical body having a circumferential groove means therein with generally parallel side walls;

a continuous coil spring disposed in said circumferential groove means with a portion thereof protruding from said circumferential groove means;

a housing having a bore therein sized to accommodate said cylindrical body and groove means, disposed in an inside surface of said bore, for receiving the protruding spring portion and for enabling assembly of the cylindrical body within the bore when the cylindrical body and housing are moved in one direction with respect to one another; and means, defining a tapered bottom in said circumferential groove means, for preventing the spring from turning past a vertical line when the cylindrical body and housing are moved in another direction with respect to one another in order to prevent disassembly of the cylindrical body and housing.

2. The mechanism according to claim 1 wherein the circumferential groove means has a groove width which is smaller than a coil height of the spring.

3. The mechanism according to claim 2 wherein the tapered bottom joins one of the generally parallel side walls at an angle between about 0° and about 60°.

4. The mechanism according to claim 2 wherein the tapered bottom joins both parallel side walls at an angle between about 0° and about 60°.

5. The mechanism according to claim 4 wherein said groove means comprises a surface of revolution disposed at an angle with the cylindrical body axis.

6. The mechanism according to claim 2 wherein said tapered bottom comprises two flat surfaces intersecting one another and each disposed at an acute angle to one of said adjoining parallel side walls.

7. The mechanism according to claim 1 wherein said continuous spring includes coils sized for causing adjacent coils to abut one another upon assembly of the cylindrical body within the bore in order to increase electromagnetic shielding, electrical conductivity, thermal dissipation and environmental sealing between the cylindrical body and housing.

8. The mechanism according to claim 1 further comprising an elastomer disposed within said continuous spring.

9. The mechanism according to claim 8 wherein said elastomer has a hollow core.

10. A connect/disconnect, lock/unlock and hold mechanism for mechanical, electromagnetic shielding, electrical conductivity, and thermal dissipation coupling with environmental sealing, the mechanism comprising:

a housing including a bore therein having a circumferential groove means with generally parallel side walls;

a continuous coil spring disposed in said circumferential groove means with a portion thereof protruding from said circumferential groove means;

a cylindrical body sized for insertion into said bore and groove means, disposed on an outside surface of said cylindrical body, for receiving the protruding spring portion and for enabling assembly of the cylindrical body within the bore when the cylindrical body and housing are moved in one direction with respect to one another; and means, defining a tapered bottom in said circumferential groove means, for preventing the spring from turning past a vertical line when the cylindrical body and housing are moved in another direction with respect to one another in order to prevent disassembly of the cylindrical body and housing.

11. The mechanism according to claim 10 wherein the circumferential groove means has a groove width which is smaller than a coil height of the spring.

12. The mechanism according to claim 11 wherein the tapered bottom joins one of the generally parallel side walls at an angle between about 10° and about 20°.

13. The mechanism according to claim 11 wherein the tapered bottom joins both parallel side walls at an angle between about 10° and about 20°.

14. The mechanism according to claim 13 wherein said groove means comprises a surface of revolution disposed at an angle with the cylindrical body axis.

15. The mechanism according to claim 11 wherein said tapered bottom comprises two flat surfaces intersecting one another and each disposed at an acute angle to one of said adjoining parallel side walls.

16. The mechanism according to claim 10 wherein said continuous spring includes coils sized for causing adjacent coils to abut one another upon assembly of the cylindrical body within the bore in order to increase electromagnetic shielding, electrical conductivity, thermal dissipation and environmental sealing between the cylindrical body and housing.

17. The mechanism according to claim 10 further comprising an elastomer disposed within said continuous spring.

18. The mechanism according to claim 17 wherein said elastomer has a hollow core.

19. A snap-on fastening mechanism for mechanical, electromagnetic shielding, electrical conductivity, and thermal dissipation coupling with environmental sealing, the mechanism comprising:

a cylindrical body having a body diameter and an end portion having a diameter smaller than the body diameter;

means defining a circumferential groove in said end portion with generally parallel side walls;

a continuous coil spring disposed in said circumferential groove with a portion thereof protruding from said circumferential groove;

plate means, having a selected thickness and an opening therein with a diameter greater than the end portion diameter and smaller than the body diameter, for receiving the end portion with the spring protruding from the circumferential groove on a side of the plate means opposite another side of the plate means facing the cylindrical body;

means, defining a tapered bottom in said circumferential groove, for preventing the spring from turning past a line perpendicular to the cylindrical body axis in order to prevent dis-assembly of the cylindrical body from the plate means.

20. The mechanism according to claim 19 wherein the circumferential groove has a groove width which is smaller than a coil height of the spring.

21. The mechanism according to claim 20 wherein the tapered bottom joins one of the generally parallel side walls at an angle between about 0° and about 60°.

22. The mechanism according to claim 20 wherein the tapered bottom joins both parallel side walls at an angle between about 0° and about 60°.

23. The mechanism according to claim 19 wherein said continuous spring includes coils sized for causing adjacent coils to abut one another upon assembly of the cylindrical body within the bore in order to increase electromagnetic shielding, electrical conductivity, thermal dissipation and environmental sealing between the cylindrical body and plate means.

24. The mechanism according to claim 19 further comprising an elastomer disposed within said continuous spring.

25. The mechanism according to claim 24 wherein said elastomer has a hollow core.

26. A connect/disconnect, lock/unlock and hold mechanism for mechanical, electromagnetic shielding, electrical conductivity, and thermal dissipation coupling with environmental sealing, the mechanism comprising:

a spherical body having a circumferential groove means therein with generally parallel side walls;

a continuous coil spring disposed in said circumferential groove means with a portion thereof protruding from said circumferential groove means;

a housing having a bore therein sized to accommodate said spherical body and groove means, disposed in an inside surface of said bore, for receiving the protruding spring portion and for enabling assembly of the spherical body within the bore when the spherical body and housing are moved in one direction with respect to one another; and means, defining a tapered bottom in said circumferential groove, for preventing the spring from turning past a vertical line when the spherical body and housing are moved in another direction with respect to one another in order to prevent disassembly of the spherical body and housing.

27. The mechanism according to claim 26 wherein the circumferential groove means has a groove width which is smaller than a coil height of the spring.

28. The mechanism according to claim 27 wherein the tapered bottom joins one of the generally parallel side walls at an angle between about 10° and about 20°.

29. The mechanism according to claim 27 wherein the tapered bottom joins both parallel side walls at an angle between about 10° and about 20°.

30. A connect/disconnect, lock/unlock and hold mechanism for mechanical, electromagnetic shielding, electrical conductivity, and thermal dissipation coupling with environmental sealing, the mechanism comprising:

a housing including a bore therein having a circumferential groove means therein with generally parallel side walls;

a continuous coil spring disposed in said circumferential groove means with a portion thereof protruding from said circumferential groove means;

a spherical body sized for insertion into said bore and groove means disposed on an outside surface of said spherical body, for receiving the protruding spring portion and for enabling assembly of the spherical body within the bore when the spherical body and housing are moved in one direction with respect to one another; and means, defining a tapered bottom in said circumferential groove, for preventing the spring from turning past a vertical line when the spherical body and housing are moved in another direction with respect to one another in order to prevent disassembly of the spherical body and housing.

31. The mechanism according to claim 30 wherein the circumferential groove means has a groove width which is smaller than a coil height of the spring.

32. The mechanism according to claim 31 wherein the tapered bottom joins one of the generally parallel side walls at an angle between about 0° and about 60°.

33. The mechanism according to claim 31 wherein the tapered bottom joins both parallel side walls at an angle between about 10° and about 20°.

34. The mechanism according to claim 31 wherein said groove means comprises a surface of revolution disposed at an angle with the spherical body axis.

35. The mechanism according to claim 31 wherein said tapered bottom comprises two flat surfaces intersecting one another and each disposed at an acute angle to one of said adjoining parallel side walls.

36. The mechanism according to claim 30 wherein said continuous spring includes coils sized for causing adjacent coils to abut one another upon assembly of the spherical body within the bore in order to increase electromagnetic shielding, electrical conductivity, thermal dissipation and environmental sealing between the spherical body and housing.

\* \* \* \* \*